United States Patent
Yang et al.

(10) Patent No.: US 11,480,617 B2
(45) Date of Patent: Oct. 25, 2022

(54) APPARATUS AND METHOD FOR REAL-TIME SCHEDULING FOR SUPPRESSING BATTERY AGING IN SATELLITE SYSTEM

(71) Applicant: AJOU UNIVERSITY INDUSTRY-ACADEMIC COOPERATION FOUNDATION, Suwon-si (KR)

(72) Inventors: Hoeseok Yang, Suwon-si (KR); Seongik Jang, Suwon-si (KR)

(73) Assignee: AJOU UNIVERSITY INDUSTRY—ACADEMIC COOPERATION FOUNDATION, Suwon-si (KR)

(*) Notice: Subject to any disclaimer, the term of this patent is extended or adjusted under 35 U.S.C. 154(b) by 0 days.

(21) Appl. No.: 17/586,200

(22) Filed: Jan. 27, 2022

(65) Prior Publication Data
US 2022/0244315 A1 Aug. 4, 2022

(30) Foreign Application Priority Data
Feb. 2, 2021 (KR) .......... 10-2021-0014847

(51) Int. Cl.
G01R 31/00 (2006.01)
G01R 31/374 (2019.01)
(Continued)

(52) U.S. Cl.
CPC .......... *G01R 31/374* (2019.01); *B64G 1/425* (2013.01); *G01R 31/367* (2019.01);
(Continued)

(58) Field of Classification Search
USPC .............................. 324/426, 434, 630, 73.1
See application file for complete search history.

(56) References Cited

U.S. PATENT DOCUMENTS

2019/0165580 A1* 5/2019 Doherty .................... H02J 3/32
2019/0369166 A1* 12/2019 Moslemi ................ H02J 3/144

FOREIGN PATENT DOCUMENTS

| JP | 2016-071841 A | 5/2016 |
| KR | 10-2011-0057015 A | 5/2011 |
| KR | 10-2011-0128023 A | 11/2011 |

OTHER PUBLICATIONS

Jaeheon Kwak, et al., "Battery Aging Deceleration for Power-Consuming Real-Time Systems", IEEE Real-Time Systems Symposium, 2019, pp. 353-365.

* cited by examiner

*Primary Examiner* — Vincent Q Nguyen
(74) *Attorney, Agent, or Firm* — Sughrue Mion, PLLC (57) ABSTRACT

A real-time scheduling apparatus and method for suppressing battery aging of a satellite system are disclosed. A real-time scheduling method for suppressing battery aging of a satellite system according to an exemplary embodiment of the present disclosure may include acquiring task information including a request period and an execution time of each of a plurality of tasks which is performed in the satellite system; determining an execution limit range and an execution order for each of the plurality of tasks which satisfies a predetermined real-time constraint based on the task information; and determining an optimal execution timing within the execution limit range of each of the plurality of tasks, based on the execution order and consumed current information of each of the plurality of tasks.

12 Claims, 6 Drawing Sheets

(51) Int. Cl.
 *G01R 31/367* (2019.01)
 *H02J 7/00* (2006.01)
 *B64G 1/42* (2006.01)
 *G06F 1/3212* (2019.01)

(52) U.S. Cl.
 CPC .......... *G06F 1/3212* (2013.01); *H02J 7/0047* (2013.01); *H02J 7/0071* (2020.01)

APPARATUS AND METHOD FOR REAL-TIME SCHEDULING FOR SUPPRESSING BATTERY AGING IN SATELLITE SYSTEM

CROSS-REFERENCE TO RELATED APPLICATIONS

This application claims the priority of Korean Patent Application No. 10-2021-0014847 filed on Feb. 2, 2021, in the Korean Intellectual Property Office, the disclosure of which is incorporated herein by reference.

BACKGROUND

Field

The present disclosure relates to an apparatus and a method for real-time scheduling for suppressing battery aging of a satellite system.

Description of the Related Art

It is known that there is an aging phenomenon that as a lithium ion battery is repeatedly charged and discharged, an available capacity is reduced. The aging phenomenon that the available capacity is reduced is caused not by one aging phenomenon, but by an interaction of multiple mechanisms. At this time, the characteristics of the mechanism vary depending on the temperature so that the major aging phenomenon also varies depending on the operating temperature.

It is known that the aging phenomenon in accordance with the temperature is accelerated as the temperature rises. However, even though the battery is charged at a low temperature, the battery aging is accelerated due to a lithium plating phenomenon so that the available capacity is rapidly reduced. Such an aging phenomenon may be particularly fatal for satellites in which the temperature rapidly changes depending on whether there is sunlight and the battery is used as a power source.

Figure 1A:
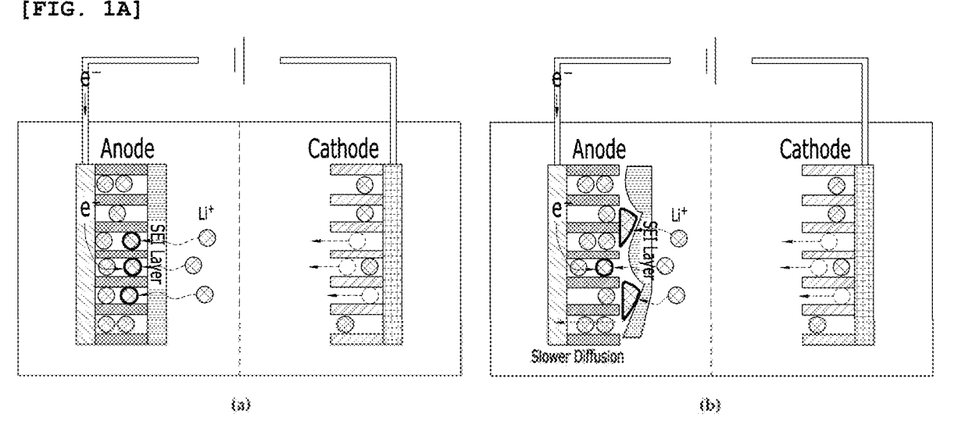
FIG. 1A is a view for explaining a lithium plating phenomenon.

FIG. 1A is a view for explaining a lithium plating phenomenon.

Referring to FIG. 1A, during a normal charging process of the battery, the lithium ions are inserted in an anode. However, when the battery temperature is extremely low, as illustrated in FIG. 1A(b), the diffusion at the anode side becomes slow and lithium ions are accumulated on a surface of the anode to reduce the available lithium ions of the battery, which reduces the battery capacity. Further, there may be a risk that the lithium which is plated on the surface of the pole causes the short circuit in the battery.

As described above, the factors which affect the lifespan of the battery may vary depending on an operating temperature of a system in which the battery is loaded. Therefore, it is understood that in order to extend the battery lifespan in a satellite system which operates in various temperature conditions which broadly change, it is important to manage the battery lifespan by considering the influence by the ambient temperature.

Figure 1B:
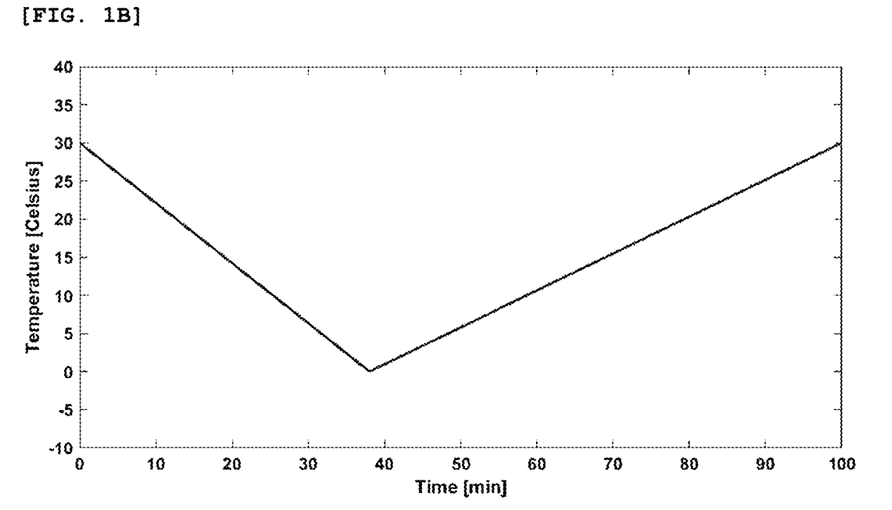
FIG. 1B is a view illustrating a periodic change in an ambient temperature of a low earth orbit (LEO) satellite.

FIG. 1B is a view illustrating a periodic change in an ambient temperature of a low earth orbit (LEO) satellite.

Referring to FIG. 1B, in the low earth orbit (LEO) satellite, a period in which sunlight is received at a constant period (a sun-light period in which the temperature is increased) and a period in which the sun is blocked by the earth (an eclipse period in which the temperature is decreased) are repeated. Generally, in the case of the satellite which is supplied with a power to be used from a solar cell, the battery is charged during the period when the sunlight is received so as to be operated even during the period when the sunlight is blocked.

The temperature of the battery which is loaded in such a low earth orbit satellite is rapidly decreased during the period when the sun is blocked. Accordingly, the temperature of the battery is lowest at a timing at which the period of receiving the sunlight starts again. At this time, when the battery is charged with the sunlight, the above-described lithium plating phenomenon which is accelerated when the battery is charged at a low temperature is accelerated, which deteriorates the lifespan of the battery.

With regard to this, the real-time scheduling technique which considers the aging phenomenon of the lithium ion battery of the related art proposes a real-time scheduling technique which minimizes the heat generation based on the analysis of a battery heating model by considering only the generally known aging phenomenon which is accelerated at a high temperature. However, when the scheduling technique of the related art is applied to the system which charges the battery at a low temperature, there is a problem in that the lifespan of the battery may be deteriorated by the lithium plating phenomenon.

A related art of the present disclosure is disclosed in Korean Unexamined Patent Application Publication No. 10-2011-0128023.

SUMMARY

The present disclosure is provided to solve the problem of the related art and an object of the present disclosure is to provide an apparatus and a method for real-time scheduling for suppressing the battery aging of a satellite system which increases a temperature as needed to suppress the aging phenomenon of the battery in a system which operates at a low temperature and is periodically charged, such as a low earth orbit satellite.

However, objects to be achieved by various embodiments of the present disclosure are not limited to the technical objects as described above and other technical objects may be present.

As a technical means to achieve the above-described technical object, according to an aspect of the present disclosure, a real-time scheduling method for suppressing battery aging of a satellite system may include: acquiring task information including a request period and an execution time of each of a plurality of tasks which is performed in the satellite system; determining an execution limit range and an execution order for each of the plurality of tasks which satisfies a predetermined real-time constraint based on the task information; and determining an optimal execution timing within the execution limit range of each of the plurality of tasks, based on the execution order and consumed current information of each of the plurality of tasks.

Further, in the determining of an optimal execution timing, the optimal execution timing may be determined to maximize a sum of consumed currents of the plurality of tasks.

Further, in the determining of an optimal execution timing, the optimal execution timing which allows a target task to be simultaneously executed as much as possible in the order of larger consumed current, among the target tasks, may be determined for each of the target tasks to maximize a variance of the consumed currents by the target task whose execution request is received and execution order arrives.

Further, in the determining of an optimal execution timing, when the variances are equal, the optimal execution timing may be determined to start the target task the latest within the execution limit range for the target task.

Further, the battery may be a lithium ion battery.

Further, as the plurality of tasks is simultaneously executed, the heat generated in the lithium ion battery is increased to reduce the lithium plating phenomenon.

Further, the satellite system may include a plurality of sub systems which periodically and repeatedly executes at least one task among the plurality of tasks.

Further, the real-time constraint may include a first constraint which completes each of the plurality of tasks within a deadline corresponding to the request period and a second constraint which occupies any one sub system until any one task is completed when any one task among the plurality of tasks starts in any one sub system among the plurality of sub systems.

Further, the execution limit range may be a limit which delays the execution timing of the task as much as possible within a range which satisfies the first constraint and the second constraint.

Further, the satellite system may be a low earth orbit (LEO) satellite system.

In the meantime, according to another aspect of the present disclosure, a real-time scheduling apparatus for suppressing battery aging of a satellite system may include: a collecting unit which acquires task information including a request period and an execution time of each of a plurality of tasks which is performed in the satellite system; an analyzing unit which determines an execution limit range and an execution order for each of the plurality of tasks which satisfies a predetermined real-time constraint based on the task information; and a scheduling unit which determines an optimal execution timing within the execution limit range of each of the plurality of tasks, based on the execution order and consumed current information of each of the plurality of tasks.

Further, the scheduling unit may determine the optimal execution timing to maximize a sum of consumed currents of the plurality of tasks.

Further, the scheduling unit may determine the optimal execution timing which allows a target task to be simultaneously executed as much as possible in the order of larger consumed current, among the target tasks, for each of the target tasks to maximize a variance of the consumed currents by the target task whose execution request is received and execution order arrives.

When the variances are equal, the scheduling unit may determine the optimal execution timing to start the target task the latest within the execution limit range for the target task.

The above-described solving means are merely illustrative but should not be construed as limiting the present disclosure. In addition to the above-described embodiments, additional embodiments may be further provided in the drawings and the detailed description of the present disclosure.

According to the solving means of the present disclosure, it is possible to provide an apparatus and a method for real-time scheduling for suppressing the battery aging of a satellite system which increases a temperature as needed to suppress the aging phenomenon of the battery in a system which operates at a low temperature and is periodically charged, such as a low earth orbit satellite.

However, the effect which can be achieved by the present disclosure is not limited to the above-described effects, there may be other effects.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, the present disclosure will be described more fully hereinafter with reference to the accompanying drawings, in which exemplary embodiments of the present disclosure are shown so that those skilled in the art to which the present disclosure pertains can easily implement them. However, the present disclosure can be realized in various different forms, and is not limited to the embodiments described herein. Accordingly, in order to clearly explain the present disclosure in the drawings, portions not related to the description are omitted. Like reference numerals designate like elements throughout the specification.

Throughout this specification and the claims that follow, when it is described that an element is "coupled" to another element, the element may be "directly coupled" to the other element or "electrically coupled" or "indirectly coupled" to the other element through a third element.

Through the specification of the present disclosure, when one member is located "on", "above", "on an upper portion", "below", "under", and "on a lower portion" of the other member, the member may be adjacent to the other member or a third member may be disposed between the above two members.

In the specification of the present disclosure, unless explicitly described to the contrary, the word "comprise" and variations such as "comprises" or "comprising", will be understood to imply the inclusion of stated elements but not the exclusion of any other elements.

The present disclosure relates to an apparatus and a method for real-time scheduling for suppressing battery aging of a satellite system.

Figure 2:
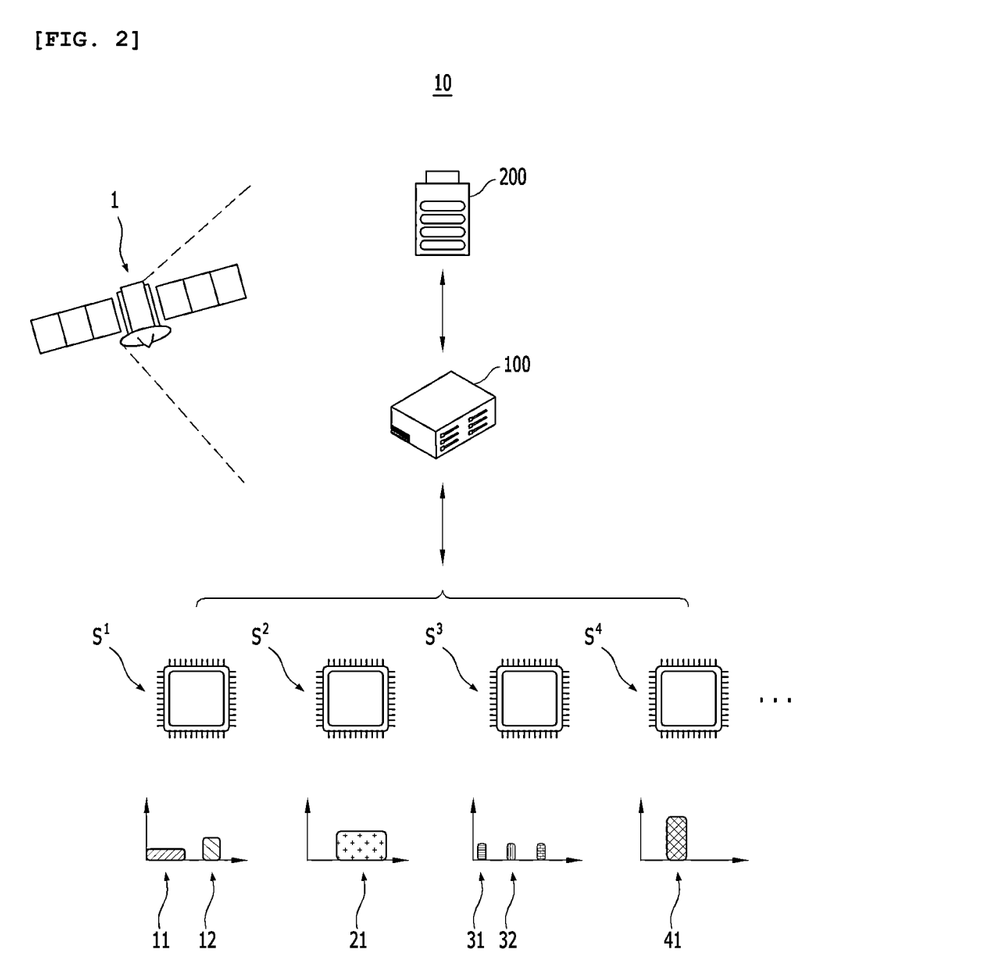
FIG. 2 is a schematic configuration diagram of a satellite system including a real-time scheduling apparatus for suppressing battery aging of a satellite system according to an exemplary embodiment of the present disclosure.

FIG. 2 is a schematic configuration diagram of a satellite system including a real-time scheduling apparatus for suppressing battery aging of a satellite system according to an exemplary embodiment of the present disclosure.

Referring to FIG. 2, a satellite system 10 according to an exemplary embodiment of the present disclosure may include a real-time scheduling apparatus 100 (hereinafter, referred to as a scheduling apparatus 100) which suppresses the battery aging of the satellite system according to the exemplary embodiment of the present disclosure and a battery 200.

Specifically, referring to FIG. 2, the satellite system 10 may include a scheduling apparatus 100 which performs real-time scheduling to determine an execution order between tasks and an execution timing of each task in each processor (sub systems) which performs tasks which are periodically and repeatedly executed in the satellite 1 so as to suppress the aging of the battery 200 loaded in a low earth orbit (LEO) satellite 1 and improve the lifespan of the battery 200.

In other words, the satellite system 10 disclosed in the present disclosure may be implemented for the low earth orbit (LEO) satellite 1, but is not limited thereto and the scheduling technique disclosed in the present disclosure may be widely applied to various systems such as satellites, automobiles, and transportation means having a low temperature operation section.

Referring to FIG. 2, the satellite system 10 may include a plurality of sub systems $S^i$, $S^j$ which periodically repeats at least one task among a plurality of tasks for driving the low earth orbit (LEO) satellite 1. For example, referring to FIG. 2, the satellite system 10 may include four sub systems including a first sub system $S^1$ to fourth sub system $S^4$, but is not limited thereto so that depending on the implementation example of the present disclosure, the number of the plurality of sub systems $S^i$, $S^j$ provided in the satellite system 10 may vary.

Further, according to the exemplary embodiment of the present disclosure, the plurality of sub systems $S^i$, $S^j$ may be divided according to the function performed to drive the low earth orbit (LEO) satellite 1, and the like. For example, the satellite system 10 may be divided based on a type (category) of a task required to be periodically or repeatedly performed to drive the satellite, such as computation, communication, information collection (sensing), or propulsion, but is not limited thereto.

In the meantime, the exemplary embodiment of the present disclosure will be described by assuming that the battery 200 is provided as a single power source in the satellite system 10 to supply power to each sub system to perform the task. However, according to the implementation example of the present disclosure, a plurality of batteries 200 may also be provided in the satellite system 10. With regard to this, it is assumed that a single battery 200 is provided in the satellite system 10, so that when a current consumed in each sub system by the task performed for every sub system is summed, overall discharged current information of the battery may be acquired.

Further, according to the exemplary embodiment of the present disclosure, the battery 200 may be a lithium ion battery. With regard to this, the scheduling apparatus 100 establishes a scheduling policy to allow a plurality of tasks to be simultaneously executed as much as possible to increase the heat generated in the battery 200 which is a lithium ion battery to reduce the lithium plating phenomenon and suppress the aging phenomenon of the battery 200 to improve the lifespan.

The scheduling apparatus 100, the battery 200, and the plurality of sub systems $S^i$ and $S^j$ may communicate with each other via a network (not illustrated). The network (not illustrated) means a connection structure which allows information exchange between respective nodes such as terminals or servers. Examples of the network (not illustrated) include 3rd generation partnership project (3GPP) network, a long term evolution network, a 5G network, a world interoperability for microwave access (WiMAX) network, Internet, a local area network (LAN), a wireless local area network (wireless LAN), a wide area network (WAN), a personal area network (PAN), a Wi-Fi network, a Bluetooth network, a satellite broadcasting network, an analog broadcasting network, and a digital multimedia broadcasting (DMB) network, but are not limited thereto.

Hereinafter, the specific function and operation of the scheduling apparatus 100 will be described in detail.

The scheduling apparatus 100 may acquire task information including a request period of each of a plurality of tasks executed in the satellite system 10 and an execution time.

Figure 3:
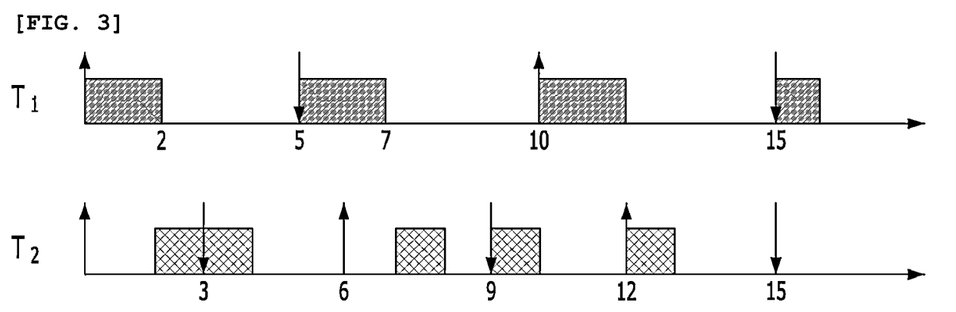
FIG. 3 is a conceptual view explaining task information.

FIG. 3 is a conceptual view explaining task information.

Referring to FIG. 3, the scheduling apparatus 100 may acquire a type of a task performed for every sub system, a request period of each of the plurality of tasks, an execution time, and a consumed current, as the task information. For example, it is understood that a first task $\tau_1$ illustrated in FIG. 3 is a task in which a request period is 5 unit times (for example, seconds) and the execution time is 2 unit times and a second task $\tau_2$ illustrated in FIG. 3 is a task in which a request period is 3 unit times and the execution time is 1 unit time.

With regard to this, each of the plurality of tasks is periodically and repeatedly performed in the satellite system 10 and thus the execution request for each of the plurality of tasks may be periodically and repeatedly generated during the operation of the satellite system 10. Accordingly, the scheduling apparatus 100 performs the scheduling to determine an execution order and an execution timing for every task by considering a period of the execution request for every task and an execution time taken to perform each of the tasks. Further, in the scheduling, consumed current information for each of the tasks may be considered to change the heat generation of the battery 200 to a desired direction.

For example, referring to FIG. 2, when the satellite system 10 includes a first sub system $S^1$ to fourth sub system $S^4$, the scheduling apparatus 100 may acquire a fact that in the first sub system $S^1$, two tasks 11 and 12 are repeatedly performed, in the second sub system $S^2$, one task 21 is repeatedly performed, in the third sub system $S^3$, two tasks 31 and 32 are repeatedly performed, and in the fourth sub system $S^4$, one task 41 is repeatedly performed, a request period of each task 11, 12, 21, 31, 32, 41, the execution time, and consumed current information as task information. In the meantime, referring to a graph in a lower side of FIG. 2, a horizontal axis is a time and a vertical axis is a consumed current I in accordance with execution of a task. Accordingly, the request period of the task refers to a reference interval of a horizontal axis between respective tasks, the execution time of the task refers to a reference length of a horizontal axis of a time when a distinguishably represented task is performed, and a consumed current of the task refers to a height of a vertical axis when the distinguishably represented task is performed, which will be applied to FIGS. 4 and 5 to be described below in the same way.

Further, the scheduling apparatus 100 may determine an execution limit range and an execution order for each of the plurality of tasks which satisfies a predetermined real-time constraint based on the task information.

Specifically, according to the exemplary embodiment of the present disclosure, the real-time constraint for determining an execution limit range and an execution order of each task may include a first constrain that each of the plurality of tasks is completed in a deadline corresponding to a request period. In other words, the request period which is included in the task information about a predetermined task may be understood as a time range until an execution request of a subsequent task is received after requesting the execution of the task. Therefore, the request period may be a deadline that the task needs to be completed until a subsequent execution request is received in accordance with the execution request which is performed earlier.

With regard to this, by considering that in the system such as automobiles or satellites, it should be guaranteed to perform the task which is consistently requested within a given deadline, the scheduling apparatus 100 disclosed in the present disclosure may operate to establish the scheduling policy which satisfies all the deadlines for each of the plurality of tasks.

Further, the scheduling apparatus 100 may determine the execution order by means of the earliest deadline first (EDF)-based scheduling based on the task information. Here, the task execution order is not determined collectively for the entire tasks performed in the satellite system 10, but may be determined individually for every sub system.

For example, with regard to the first sub system $S^1$ in which two tasks are periodically and repeatedly performed, when execution requests for the first task 11 and the second task 12 are received together, an execution order meaning that any one task of two tasks is performed first and then the remaining task is executed may be determined to perform first a task having a deadline which arrives first among deadlines determined based on the request periods of the first task 11 and the second task 12. Accordingly, when the execution requests for the plurality of tasks are simultaneously received, the scheduling policy may be established to perform a task having a shorter request period first.

Further, according to the exemplary embodiment of the present disclosure, the real-time constraint for determining the execution limit range and the execution order of each task may include a second constraint that when any one task among the plurality of tasks is started in any one sub system among the plurality of sub systems, the corresponding sub system (the above-described any one sub system) is occupied until the corresponding task (the above-described any one task) is completed.

With regard to this, it means that the second constraint follows a preemptive scheduling method between preemptive scheduling and non-preemptive scheduling which are divided depending on whether one task which is being performed can be stopped by the other task in the middle of performing the task.

According to the non-preemptive scheduling, when one task is started first in a specific sub system, even though the remaining task is not completed within the request period of the corresponding task unless the remaining task to be performed in the corresponding sub system is not immediately started at the present time, the remaining task cannot preempt the sub system by completing the task in progress which has been already started.

In other words, the scheduling apparatus 100 disclosed in the present disclosure determines the execution order to perform a task whose deadlines is the closest to the corresponding timing, among tasks (requested tasks) remaining at the timing at which the execution of an arbitrary task is completed, in the predetermined sub system, by considering the first constraint and the second constraint. Therefore, even though a request of a task whose deadline arrives earlier than the deadline of the corresponding task immediately after starting the task which is determined to be performed first is additionally received, the scheduling apparatus may start the newly received task after completing the task which is being currently performed.

Specifically, the scheduling apparatus 100 may have an algorithm (discriminant) outputting whether there is an execution order to perform the overall tasks without violating the deadlines of all the tasks when the real-time scheduling is performed based on the above-described EDF policy, among the combination of the execution orders which may be determined between the plurality of tasks by the information about the request period and the execution time of each task included in the task information for every task.

That is, when the task information about a plurality of given tasks is input, the algorithm (determinant) held by the scheduling device 100 to determine the execution order of the plurality of tasks may output (return) "true" when there is a combination of execution orders which can be performed without violating deadline by the non-preemptive EDF schedule and output (return) "false" when the tasks cannot be performed with respect to all the combinations of the execution orders without violating the deadline by the non-preemptive EDF scheduling.

Further, the scheduling apparatus 100 may derive the execution limit range which is a limit that delays the execution timing of the corresponding task as much as possible within a range that satisfies the first constraint and the second constraint.

With regard to this, when the characteristic of the satellite system 10 is considered, the real-time scheduling which is performed by the scheduling apparatus 100 has a limit which delays the execution of the task as needed within the range established to complete each of the plurality of tasks within a given deadline (a timing at which a subsequent request period arrives). Further, the execution request for each task is periodically received so that the task cannot be performed in advance before receiving the execution request. Accordingly, the scheduling apparatus 100 derives the execution limit range which is a limit which delays the executing timing of each task within a range which satisfies the first constraint and the second constraint to determine an optimal execution timing of each task within the execution limit range to prevent the aging phenomenon of the battery 200, which will be described below.

Further, according to the exemplary embodiment of the present disclosure, the scheduling apparatus 100 determines whether the real-time constraint is satisfied by adding a virtual execution time for each task by at least one unit time to derive the execution limit range. That is, even though the task information includes information about an execution time of a task representing a time when the task is actually executed, if it is determined that all the tasks are scheduled without violating the real-time constraint even when the execution time of a specific task is increased by one unit time, the scheduling apparatus 100 may determine the execution limit range for the task based on the added virtual execution time.

Further, the scheduling apparatus 100 repeatedly may determine whether the scheduling is available in accordance with the addition of the virtual execution time by a unit time for all the tasks performed in all the sub systems in the satellite system 10 and repeat until the virtual execution time becomes maximum within the range which satisfies the real-time constraint.

As described above, the scheduling apparatus 100 analyzes whether all the tasks can be executed no matter how long each task is performed even though the execution time of each task is not actually changed to derive the execution limit range which is a limit which delays the execution of each task for a predetermined purpose in response to the difference between a time when the task needs to be actually performed and an extended time (a virtual execution time).

Further, each sub system may be preempted for the task in a time window corresponding to the execution limit range of the specific task. For example, when it is assumed that between the first task 11 and the second task 12 performed in the first sub system $S^1$, the execution order is determined to perform the first task 11 first and the execution limit range for the first task 11 is t seconds, the first sub system $S^1$ is preempted by the first task 11 for t seconds from the timing at which the execution request for the first task 11 is received. Therefore, even though the first task 11 is completed before t seconds elapse, the scheduling apparatus 100 may start the second task 12 after t seconds elapse. For reference, the execution limit range may also be referred to as a reservation time RT by considering a characteristic that the sub system is preempted for a task.

When the execution limit range (reservation time) for each of the plurality of tasks is determined by means of the above-described process, the scheduling apparatus 100 may determine the optimal execution timing within the execution limit range of each of the plurality of tasks based on the determined execution order and the consumed current information of each of the plurality of tasks.

Specifically, the process of deriving the above-described execution limit range may be performed by means of task information in an offline environment, rather than an on-line environment in which the satellite system 10 is driven in real-time. However, the optimal execution timing determining process for every task which will be described in detail may be performed in real-time in the on-line environment in which the satellite system 10 operates.

In other words, even though the task information is ensured in the offline environment, in the real-time driving environment of the satellite system 10, an execution request for a specific task may be received with a minute error from the request period, according to a communication environment, and the like. Therefore, the scheduling apparatus 100 may determine the optimal execution timing of the task in real-time (on-line) by reflecting a timing at which the execution request is actually received so as to schedule the plurality of tasks by reflecting the real-time error.

According to the exemplary embodiment of the present disclosure, the scheduling apparatus 100 may determine the optimal execution timing of each of the plurality of tasks within the execution limit range so as to maximize the sum of consumed currents of the plurality of tasks, based on the determined execution order and the consumed current information of each of the tasks.

With regard to this, an amount of heat generated in the battery 200 is mainly determined in proportion to a square of the current so that if the task is performed in the sub system so that a large amount of currents flows, the heat generation is increased and in contrast, if the task is not performed so that less current flows, the heat generation is reduced. In the meantime, in an environment in which types of tasks which are periodically and repeatedly performed and an executed amount are fixed and the task needs to be performed within the given deadline (a request period) every time, such as the satellite system 10, it is not possible to increase or decrease an amount of current flowing through the battery only by changing the execution order of the task. Therefore, the scheduling apparatus 100 establishes a scheduling policy which maximizes the square of discharged current of the battery 200, that is, maximizes a variance of the current to maximize the heat generated in the battery 200, thereby reducing the generation of the lithium plating phenomenon.

Figure 4:
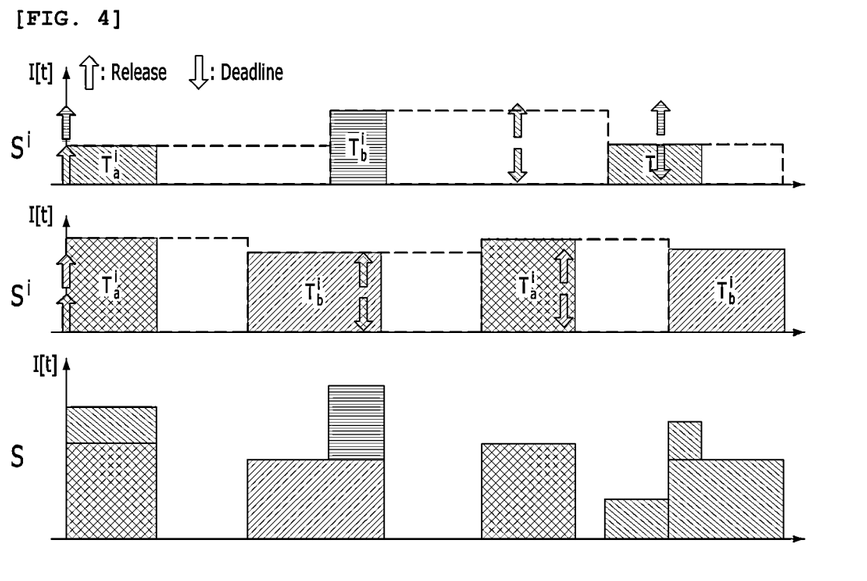
FIG. 4 is a view time-sequentially illustrating a process which determines an optimal execution timing of a task so as to maximize a variance of a battery current consumption.

FIG. 4 is a view time-sequentially illustrating a process which determines an optimal execution timing of a task so as to maximize a variance of a battery current consumption.

Figure 5:
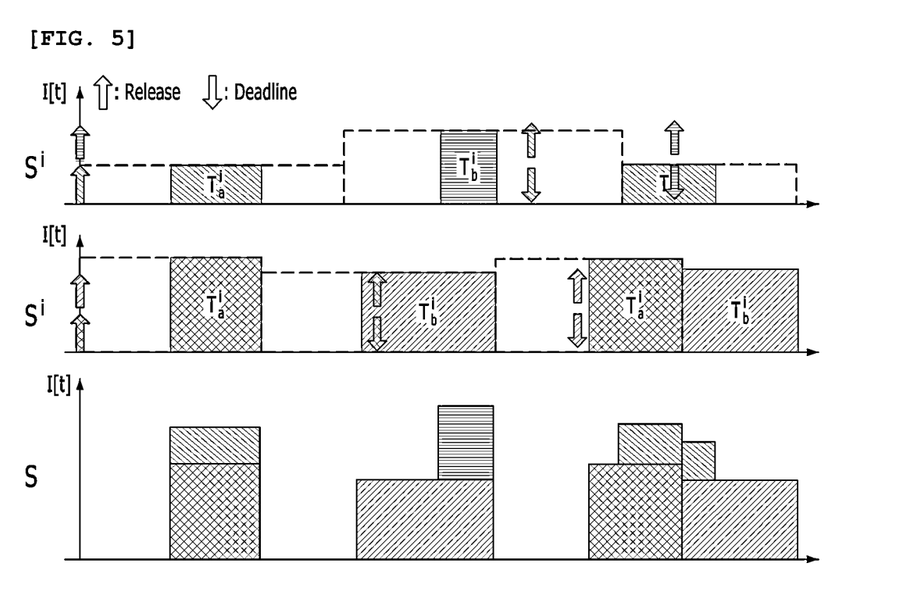
FIG. 5 is a view time-sequentially illustrating a process which determines an optimal execution timing to maximize a variance of the battery current consumption and start the task the latest within an execution limit range.

For reference, FIGS. 4 and 5 illustrate a satellite system 10 including a first sub system $S^i$ and a second sub system $S^j$ in which the first sub system $S^i$ repeatedly performs a first task $\tau_a^i$ and a second task $\tau_b^i$ and the second sub system $S^j$ repeatedly performs a third task $\tau_a^j$ and a fourth task $\tau_b^j$. Hereinafter, an exemplary embodiment which determines an optimal execution timing for every task in real-time based on the execution request received by on-line based on the execution order and the execution limit range determined in the off-line with respect to the satellite system 10 having such a design/operation condition will be described.

In the meantime, in FIGS. 4 and 5, the execution limit range of each of the first task to the fourth task is represented with a rectangular dotted-line boundary, a timing at which the execution request for each task is received is represented by an upward arrow (release, ↑) on a timeline, and a deadline for the corresponding task is represented with a downward arrow (deadline, ↓) corresponding to the upward arrow on the timeline. In the meantime, since a timing at which a subsequent execution request of the specific task is received corresponds to a deadline for a previous execution request, when the timing (origin) at which an initial execution request is received is excluded, the upward arrow (↑) and the downward arrow ↓) may overlap on the same time window.

Referring to FIG. 4, the scheduling apparatus 100 may determine, for each target task, an optimal execution timing which allows a target task to be simultaneously executed as much as possible in the order of the larger consumed current, among the target tasks, to maximize the variation of the consumed current by the target task whose execution request is received and execution order arrives, in the tasks of the entire sub system. Further, the scheduling apparatus 100 may sort all the tasks (target tasks) whose execution orders arrive in the order of consumed current and sequentially determine an optimal execution timing which maximizes a variation of the consumed currents by all the target tasks in the order of the consumed currents of the tasks from a task having a relatively larger consumed current to a target task having a relatively smaller consumed current.

To be more specific, for better understanding, it is confirmed that the execution requests of the first to fourth tasks are received at the origin (initial timing) of the time line illustrated in FIG. 4, at the corresponding timing, the execution order of the first task $\tau_a^i$ arrives in the first sub system $S^i$ and the execution order of the third task $\tau_a^j$ arrives in the second sub system $S^j$ and between two tasks whose execution orders arrive, the consumed current (vertical axis) of the third task $\tau_a^j$ is larger. Accordingly, the scheduling apparatus 100 may determine an optimal execution timing of the third task $\tau_a^j$ which is a maximum current task first and determine a timing which is simultaneously executed with the third task $\tau_a^j$ as much as possible as the optimal execution timing of the first task $\tau_a^i$ which is the remaining task. Therefore, according to the scheduling method illustrated in FIG. 4, the first task $\tau_a^i$ and the third task $\tau_a^j$ may simultaneously start at a timing corresponding to the origin of the time line.

The scheduling apparatus 100 may determine an optimal execution timing of the fourth task $\tau_b^j$ whose execution timing arrives at the timing at which the execution limit range (dotted line boundary) of the third task $\tau_a^j$ is completed and determine a timing which is simultaneously executed with the fourth task $\tau_b^j$ as much as possible as the optimal execution timing of the second task $\tau_b^i$ which is the remaining task.

As described above, the scheduling apparatus 100 disclosed in the present disclosure establishes a scheduling policy to execute the task at a timing at which the variance for the consumed current by the task or the discharged current of the battery 200 is maximized within the derived execution limit range and whenever a specific task which starts to be executed in response to any one sub system is selected (when an execution request of a specific task is received and the execution order arrives), may repeat a process of determining a task starting timing at which the variance is maximized without immediately executing the corresponding task.

In other words, at every circumstance in which an event that a specific sub system selects an arbitrary task occurs, the scheduling apparatus 100 may consider all sub systems in which there are tasks which have not actually started to be executed, but are determined to be executed provisionally to recalculate what time is to start the entire tasks which are determined to be provisionally executed to maximize the variance of the current.

At this time, the scheduling apparatus 100 may establish the scheduling policy to maximize the variance of the current in the other sub systems by synchronizing at the moment when the first sub system is determined to perform the maximum current task by first determining an optimal execution timing in the order of the larger consumed current of the task which is determined to be provisionally executed. This process is repeated in the real-time environment in which the execution request is periodically received to perform the scheduling to increase the variance during the execution time of the satellite system 10.

FIG. 5 is a view time-sequentially illustrating a process which determines an optimal execution timing to maximize a variance of the battery current consumption and start the task the latest in an execution limit range.

Referring to FIG. 5, the scheduling apparatus 100 may establish a scheduling policy to start the task within the execution limit range of a task as late as possible during the process of determining the optimal execution timing of the task to maximize the consumed current by the entire tasks described above or the discharged current of the battery 200.

In other words, during the process of determining the optimal execution timing to maximize the variance of the consumed current by the task within the execution limit range of each task, the scheduling apparatus 100 may schedule to execute a task (target task) whose execution order arrives with the task whose execution timing is already determined based on the previously determined optimal execution timing for every task as simultaneously as possible and determine an optimal execution timing which starts the task the latest within the range which is simultaneously executed as much as possible.

That is, FIG. 4 illustrates a scheduling policy (MAX_VAR) which allows tasks executed in different sub systems to be simultaneously executed as much as possible and starts the execution of the task as quickly as possible within the execution limit range. FIG. 5 illustrates a scheduling policy (MAX_VAR_ALAP) which not only allows tasks respectively executed in different sub systems to be simultaneously executed as much as possible and but also starts the execution of the task as late as possible among timings which maximize the variance of the consumed current within each execution limit range.

With regard to this, by comparing FIGS. 4 and 5, it is confirmed that in FIG. 4, a second execution of the third task $\Sigma_a^j$ performed in the second sub system $S^j$ and a second execution of the first task $\tau_a^i$ performed in the first sub system $S^i$ do not overlap each other, but in contrast, in FIG. 5, the second execution of the third task $\tau_a^i$ performed in the second sub system $S^j$ and the second execution of the first task $\tau_a^i$ performed in the first sub system $S^i$ at least partially overlap each other.

In other words, the scheduling apparatus 100 not only determines the optimal execution timing to maximize the variance of the consumed current, but also applies the scheduling policy (MAX_VAR_ALAP) which starts the execution of the task as late as possible within each execution limit range. Therefore, a probability of simultaneously performing tasks of different sub systems may be increased as compared with the MAX_VAR scheduling policy illustrated in FIG. 4 so that the heat generated in the battery 200 may be significantly increased.

In summary, the scheduling apparatus 100 disclosed in the present disclosure may perform the scheduling to determine the optimal execution timing for each target task to maximize the variance of the consumed current in the satellite system 10 by the target task based on the current circumstance consumed by the satellite system 10 at a present time (a timing at which the scheduling is performed) in the order from the larger consumed current to the smaller consumed current of each of the target tasks (in other words, a task whose execution request is received and execution order arrives) to perform the scheduling. However, when there are two or more points (points in which the variances are maximum to be equal) at which the variance of the consumed current with regard to the specific target task is maximum, the scheduling apparatus may determine the optimal execution timing to execute the corresponding target task as late as possible within the limit which satisfies both the execution limit range and a range which maximizes the variance of the consumed current of the satellite system 10.

Accordingly, at a timing at which no task is performed, among the target tasks, a task which is preferentially scheduled and consumes a maximum current may be scheduled to be started as late as possible within the execution limit range of the corresponding task. In contrast, when there is a timing at which a predetermined task which consumes the current at a timing prior to the present timing is executed and the corresponding timing corresponds to a timing at which the variance with regard to the target task is maximum, the optimal execution timing may be determined to execute the task at a timing determined in consideration of a predetermined task executed at a previous timing rather than starting as late as possible within the execution limit range of the target task.

Figure 6:
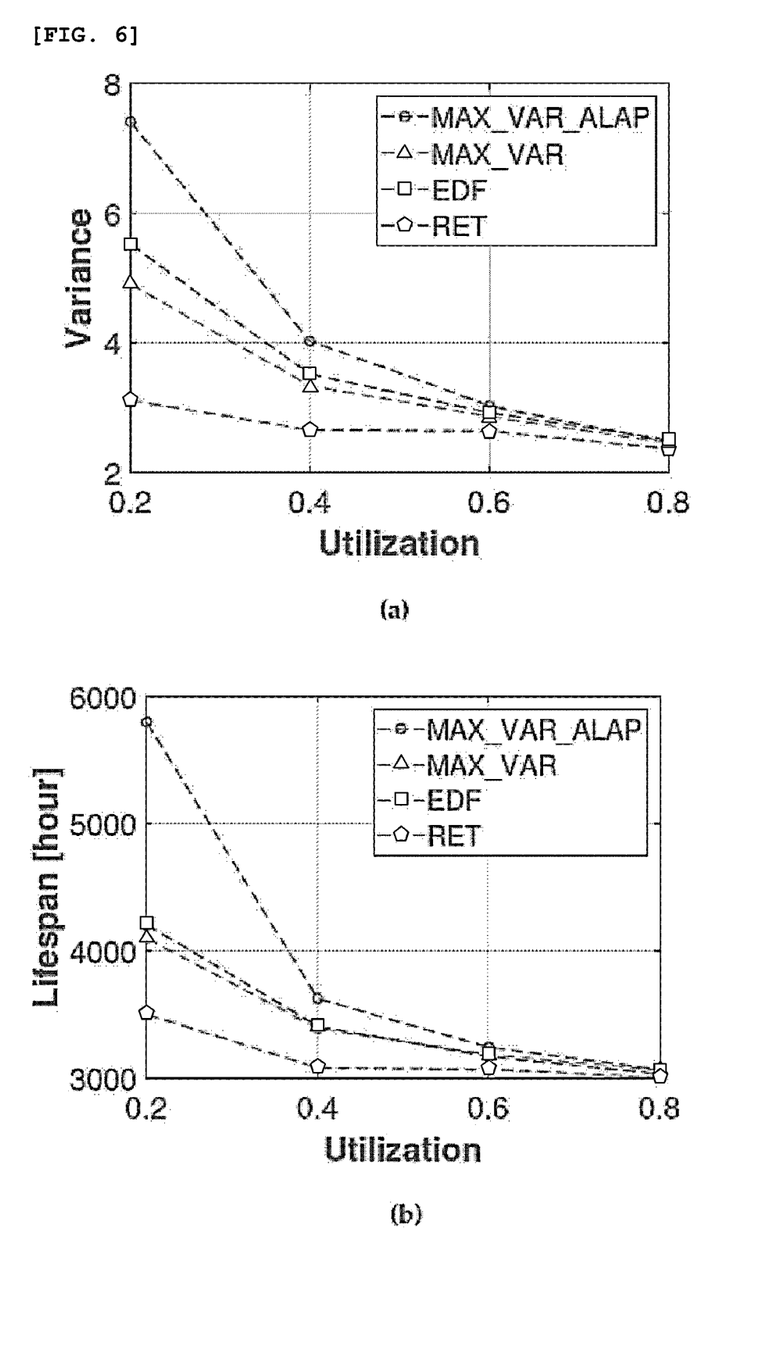
FIG. 6 is a view illustrating a lifespan changing simulation result of a satellite system according to a real-time scheduling technique of the present disclosure as one experimental example associated with the real-time scheduling technique for suppressing a battery aging of a satellite system according to an exemplary embodiment of the present disclosure.

FIG. 6 is a view illustrating a lifespan changing simulation result of a satellite system according to a real-time scheduling technique of the present disclosure as one experimental example associated with the real-time scheduling technique for suppressing a battery aging of a satellite system according to an exemplary embodiment of the present disclosure.

Referring to FIG. 6, FIG. 6 illustrates a simulation result for a change in a current variance and a change in a lifespan of the battery which are caused by applying the scheduling policy disclosed in the present disclosure to four different random task sets. Referring to (a) of FIG. 6, it is confirmed that according to the conventional technique using a scheduling technique RET which minimizes the variance of the current (to simultaneously execute the tasks as little as possible) to the contrary to the scheduling policy of the present disclosure, a minimum current variance is caused. In contrast, according to the MAX_VAR_ALAP method disclosed in the present disclosure, it is confirmed that the highest current variance with respect to all the utilization rate (a rate of a time when the current consumption occurs with respect to the entire time) is shown.

Further, referring to (b) of FIG. 6, it is confirmed that the lifetime according to the simulation shows a pattern similar to the current variance. Specifically, according to the MAX_VAR_ALAP-based scheduling disclosed in the present disclosure, it is confirmed that 65.51% of dramatic improvement of the lifespan is brought as compared with the RET technique of the related art when the utilization rate U has a minimum value (0.2). In summary of the simulation result, the scheduling policy disclosed in the present disclosure increases the variance of the consumed current as compared with the RET framework of the related art to extend the lifespan of the battery 200 of the satellite system 10. It is understood that this is because the heat generated in the battery 200 is increased by maximizing the variance of the consumed current to effectively alleviate the lithium plating phenomenon which may occur when the satellite system 10 operates at a low temperature.

Figure 7:
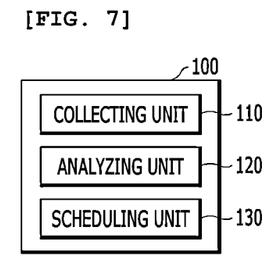
FIG. 7 is a schematic configuration diagram of a real-time scheduling apparatus for suppressing battery aging of a satellite system according to an exemplary embodiment of the present disclosure.

FIG. 7 is a schematic configuration diagram of a real-time scheduling apparatus for suppressing battery aging of a satellite system according to an exemplary embodiment of the present disclosure.

Referring to FIG. 7, the scheduling apparatus 100 may include a collecting unit 110, an analyzing unit 120, and a scheduling unit 130.

The collecting unit 110 may acquire task information including a request period and an execution time of each of a plurality of tasks executed in the satellite system 10.

The analyzing unit 120 may determine an execution limit range and an execution order for each of the plurality of tasks which satisfies a predetermined real-time constraint based on the acquired task information.

The scheduling unit 130 may determine an optimal execution timing within the execution limit range of each of the plurality of tasks based on the determined execution order and consumed current information of each of the plurality of tasks.

Hereinafter, an operation flow of the present disclosure will be described in brief based on the above-detailed description.

Figure 8:
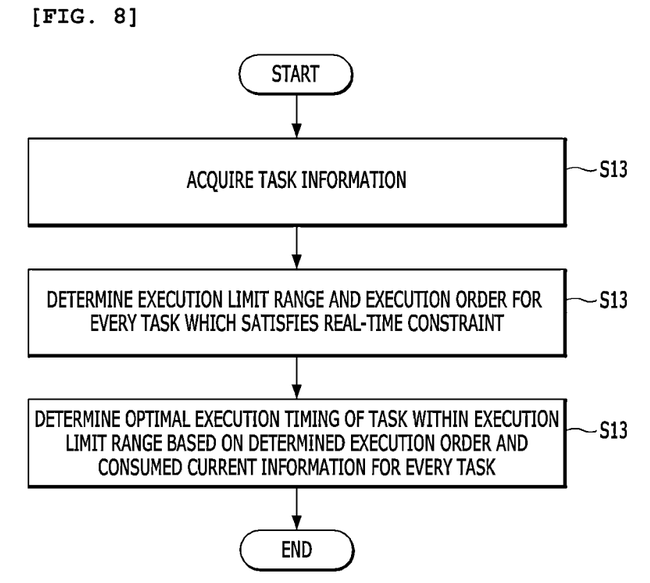
FIG. 8 is an operation flowchart of a real-time scheduling method for suppressing battery aging of a satellite system according to an exemplary embodiment of the present disclosure.

FIG. 8 is an operation flowchart of a real-time scheduling method for suppressing battery aging of a satellite system according to an exemplary embodiment of the present disclosure.

The real-time scheduling method for suppressing the battery aging of the satellite system illustrated in FIG. 8 may be performed by the above-described scheduling apparatus 100. Therefore, even though some contents are omitted below, the contents which have been described for the scheduling apparatus 100 may be applied to the real-time scheduling method for suppressing the battery aging of the satellite system in the same way.

Referring to FIG. 8, in step S11, the collecting unit 110 may acquire task information including a request period and an execution time of each of a plurality of tasks executed in the satellite system 10.

Next, in step S12, the analyzing unit 120 may determine an execution limit range and an execution order for each of the plurality of tasks which satisfies a predetermined real-time constraint based on the task information acquired by the collecting unit 110.

Next, in step S13, the scheduling unit 130 may determine an optimal execution timing for every task within the execution limit range determined for each of the plurality of tasks based on the determined execution order between the plurality of tasks and consumed current information of each of the plurality of tasks.

According to the exemplary embodiment of the present disclosure, in step S13, the scheduling unit 130 may determine an optimal execution timing to maximize a sum of consumed currents of the plurality of tasks.

Specifically, in step S13, the scheduling unit 130 may determine an optimal execution timing which allows a target task to be simultaneously executed as much as possible in the order of the larger consumed currents, among target tasks whose execution request is already received and execution order arrives in step S12, for each of the target tasks. According to the exemplary embodiment of the present disclosure, in step S13, when there are two or more timings which maximize the variance of the consumed current (in other words, when there are different timings at which the variance of the consumed current of all the tasks are maximum according to the scheduling for the target tasks), the scheduling unit 130 may determine an optimal execution timing to start the target task the latest, among the timings which maximize the variance of the consumed current within the execution limit range derived for the target task.

Further, in step S13, the scheduling unit 130 may schedule the remaining task whose execution order arrives, based on the previously determined optimal execution timing of a task, to be simultaneously executed as much as possible.

In the above-description, steps S11 to S13 may be further divided into additional steps or combined as smaller steps depending on an implementation example of the present disclosure. Further, some steps may be omitted if necessary and the order of steps may be changed.

The real-time scheduling method for suppressing battery aging of a satellite system according to the embodiment of the present disclosure may be implemented as program instructions which may be executed by various computer means to be recorded in a computer-readable medium. The computer-readable medium may include a program instruction, a data file, a data structure, and the like solely or in combination. The program instruction recorded in the medium may be specifically designed or constructed for the present disclosure or known to those skilled in the art of a computer software to be used. Examples of the computer-readable recording medium include magnetic media such as a hard disk, a floppy disk, or a magnetic tape, optical media such as a CD-ROM or a DVD, a magneto-optical media such as a floptical disk, and a hardware device which is specifically configured to store and execute the program instruction, such as a ROM, a RAM, and a flash memory. Examples of the program instruction include not only a machine language code which is created by a compiler but also a high level language code which may be executed by a computer using an interpreter. The hardware device may operate as one or more software modules in order to perform the operation of the present disclosure and vice versa.

Further, the above-described real-time scheduling method for suppressing battery aging of a satellite system may also be implemented as a computer program or an application executed by a computer which is stored in a recording medium.

The above-description of the present disclosure is illustrative only and it is understood by those skilled in the art that the present disclosure may be easily modified to another specific type without changing the technical spirit or an essential feature of the present disclosure. Thus, it is to be appreciated that the embodiments described above are intended to be illustrative in every sense, and not restrictive. For example, each component which is described as a singular form may be divided to be implemented and similarly, components which are described as a divided form may be combined to be implemented.

The scope of the present disclosure is represented by the claims to be described below rather than the detailed description, and it is to be interpreted that the meaning and scope of the claims and all the changes or modified forms derived from the equivalents thereof come within the scope of the present disclosure.

What is claimed is:

1. A real-time scheduling method for suppressing battery aging of a satellite system, the scheduling method comprising:
    acquiring, by using a collecting unit, task information including a request period and an execution time of each of a plurality of tasks which is performed in the satellite system;
    determining, by using an analyzing unit, an execution limit range and an execution order for each of the plurality of tasks which satisfies a predetermined real-time constraint based on the task information; and
    determining, by using a scheduling unit, an optimal execution timing within the execution limit range of each of the plurality of tasks, based on the execution order and consumed current information of each of the plurality of tasks,
    wherein the determining of the optimal execution timing comprises determining the optimal execution timing which allows a target task simultaneously executed as much as possible in the order of larger consumed current, among the target tasks, for each of the target tasks to maximize a variance of the consumed currents by the target task whose execution request is received and execution order arrives.

2. The scheduling method according to claim 1, wherein in the determining of an optimal execution timing, the optimal execution timing is determined to maximize a sum of consumed currents of the plurality of tasks.

3. The scheduling method according to claim 1, wherein in the determining of an optimal execution timing, when the variances are equal, the optimal execution timing is determined to start the target task the latest within the execution limit range for the target task.

4. The scheduling method according to claim 1, wherein the battery is a lithium ion battery and as the plurality of tasks is simultaneously executed, the heat generated in the lithium ion battery is increased to reduce lithium plating phenomenon.

5. The scheduling method according to claim 1, wherein the satellite system includes a plurality of sub systems which periodically and repeatedly executes at least one task among the plurality of tasks.

6. The scheduling method according to claim 5, wherein the real-time constraint includes a first constraint which completes each of the plurality of tasks within a deadline corresponding to the request period and a second constraint which occupies any one sub system until any one task is completed when any one task among the plurality of tasks starts in the any one sub system among the plurality of sub systems, and the execution limit range is a limit which delays the execution timing of the task as much as possible within a range which satisfies the first constraint and the second constraint.

7. The scheduling method according to claim 1, wherein the satellite system is a low earth orbit (LEO) satellite system.

8. A real-time scheduling apparatus for suppressing battery aging of a satellite system, the scheduling apparatus comprising:
    a collecting unit which acquires task information including a request period and an execution time of each of a plurality of tasks which is performed in the satellite system;
    an analyzing unit which determines an execution limit range and an execution order for each of the plurality of tasks which satisfies a predetermined real-time constraint based on the task information; and
    a scheduling unit which determines an optimal execution timing within the execution limit range of each of the plurality of tasks, based on the execution order and consumed current information of each of the plurality of tasks,
    wherein the scheduling unit determines the optimal execution timing which allows a target task simultaneously executed as much as possible in the order of larger consumed current, among the target tasks, for each of the target tasks to maximize a variance of the consumed currents by the target task whose execution request is received and execution order arrives.

9. The scheduling apparatus according to claim 8, wherein the scheduling unit determines the optimal execution timing to maximize a sum of consumed currents of the plurality of tasks.

10. The scheduling apparatus according to claim 8, wherein when the variances are equal, the scheduling unit determines the optimal execution timing to start the target task the latest within the execution limit range for the target task.

11. The scheduling apparatus according to claim 8, wherein the satellite system includes a plurality of sub systems which periodically and repeatedly executes at least one task among the plurality of tasks and
    the real-time constraint includes a first constraint which completes each of the plurality of tasks within a deadline corresponding to the request period and a second constraint which occupies any one sub system until any one task is completed when any one task among the plurality of tasks starts in the any one sub system among the plurality of sub systems.

12. The scheduling apparatus according to claim 11, wherein the execution limit range is a limit which delays the execution timing of the task as much as possible within a range which satisfies the first constraint and the second constraint.

\* \* \* \* \*